United States Patent
Yamada

[11] Patent Number: 6,046,653
[45] Date of Patent: Apr. 4, 2000

[54] PRINTED CIRCUIT BOARD UNIT WITH A WIRING LINE PROVIDING TERMINATION RESISTANCE

[75] Inventor: Jun Yamada, Kawasaki, Japan

[73] Assignee: Fujitsu Limited, Kawasaki, Japan

[21] Appl. No.: 09/100,971

[22] Filed: Jun. 22, 1998

[30] Foreign Application Priority Data

Dec. 12, 1997 [JP] Japan ................................. 9-342787

[51] Int. Cl.[7] .............................. H03H 7/38; H01P 1/24; H01L 23/58
[52] U.S. Cl. .............................. 333/32; 333/247; 326/30; 257/723
[58] Field of Search ........................... 333/32, 246, 247; 326/30; 257/664, 698, 723

[56] References Cited

U.S. PATENT DOCUMENTS

| | | | |
|---|---|---|---|
| 5,006,820 | 4/1991 | Prioste et al. | 333/33 |
| 5,097,232 | 3/1992 | Stopper | 333/246 X |
| 5,111,080 | 5/1992 | Mizukami et al. | 333/32 X |
| 5,422,608 | 6/1995 | Levesque | 333/22 R |
| 5,457,406 | 10/1995 | Takada et al. | 333/32 X |
| 5,635,761 | 6/1997 | Cao et al. | 257/698 X |
| 5,668,834 | 9/1997 | Takekuma et al. | 333/32 X |
| 5,864,584 | 1/1999 | Cao et al. | 333/32 X |

FOREIGN PATENT DOCUMENTS

| | | |
|---|---|---|
| 63-107129 | 5/1988 | Japan . |
| 1-162360 | 6/1989 | Japan . |
| 2-165687 | 6/1990 | Japan . |
| 7-73212 | 3/1995 | Japan . |

*Primary Examiner*—Robert Pascal
*Assistant Examiner*—Barbara Summons
*Attorney, Agent, or Firm*—Armstrong, Westerman, Hattori, McLeland & Naughton

[57] ABSTRACT

A printed circuit board including a terminating structure wherein impedance matching can be established with certainty also for a long wiring line without using a discrete part as a terminating resistor. In the terminating structure, an internal wiring line connected to a signal output terminal of a semiconductor unit is formed with a resistance value which satisfies an impedance matching condition of a printed circuit board wiring line connected to the signal output terminal. The terminating structure is applied to any application wherein impedance matching of a wiring line is established on a printed circuit board on which a semiconductor unit having an internal wiring line having a resistance higher than that of a wiring line on the printed circuit board is mounted.

8 Claims, 10 Drawing Sheets

PRINTED CIRCUIT BOARD UNIT WITH A WIRING LINE PROVIDING TERMINATION RESISTANCE

BACKGROUND OF THE INVENTION

1) Field of the Invention

The present invention relates to a printed circuit board including a terminating structure for establishing impedance matching of a wiring line for transmitting an electric signal on the printed circuit board, and more particularly to a printed circuit board including a terminating structure suitable for establishing impedance matching of a wiring line on a printed circuit board on which a semiconductor unit (including a semiconductor device itself such as an LSI and a multi-chip module) having an internal wiring line having a resistance higher than a wiring line on the printed circuit board.

2) Description of the Related Art

Generally, an electronic apparatus such as a computer system includes a printed circuit board on which a semiconductor device such as an LSI or a multi-chip module (which may sometimes be hereinafter referred to simply as MCM) which includes a plurality of semiconductor devices is mounted. On a printed circuit board of the type mentioned, semiconductor devices and/or MCMs are interconnected by wiring line patterns (hereinafter referred to simply as wiring lines) serving as signal transmission lines for transmitting electric signals (digital signals). Further, in order to assure the quality of signals transmitted over the wiring lines, each of the wiring lines is terminated so that impedance matching may be established.

In the following, ordinary terminating systems are described with reference to FIGS. 7 to 10.

FIGS. 7 and 8 show systems wherein termination is effected on the reception side. The system shown in FIG. 7 is described first. Referring to FIG. 7, a transmission buffer (driving element) 100 and a reception buffer 200 are interconnected by a wiring line (signal transmission line, transmission line) 110. The input side of the reception buffer 200 (a terminal of the wiring line 110 adjacent the reception buffer 200) is grounded through a resistor 120 having a resistance value Rg and is connected to a power supply of a voltage V through another resistor 121 having a resistance value Rv.

In this instance, where the transmission line characteristic impedance of the wiring line 110 is represented by Zo and the output impedance of the transmission buffer (driving element) 100 is represented by Zout, the matching condition is given by $$Zo = Rv//Rg$$

and the signal amplitude A is given by $$A = [(Rv//Rg)/(Rv//Rg + Zout)] \cdot V$$

where $$Rv//Rg = Rv \cdot Rg/(Rv + Rg)$$

Meanwhile, in the system shown in FIG. 8, the resistor 121 in the system shown in FIG. 7 is omitted, and the input side of the reception buffer 200 (the terminal of the wiring line 110 adjacent the reception buffer 200) is grounded through a resistor 130 having a resistance value R.

The matching condition in this instance is given by $$Zo = R$$

and the signal amplitude A is given by $$A = [R/(R + Zout)] \cdot V$$

By connecting the resistors 120 and 121 or the resistor 130 which satisfies any of the matching conditions given above to the reception side to effect reception side termination, impedance matching can be established by any of the systems shown in FIGS. 7 and 8, and since signal reflection on the reception side can be suppressed, the signal waveform does not suffer from distortion and the quality thereof is assured.

It is to be noted that, while the system shown in FIG. 7 is preferable in terms of the balance in signal amplitude, since it requires two resistance parts, the system shown in FIG. 8 which requires only one resistance part is sometimes used as a simple form.

Meanwhile, FIG. 9 shows a system wherein termination is effected on the transmission side. Referring to FIG. 9, in the system shown, a resistor 140 having a resistance value Rd is interposed in series between a transmission buffer (driving element) 100 and a wiring line 110.

The matching condition in this instance is given by $$Zo = Zout + Rd$$

and, the signal amplitude A is given by $$A = V$$

By interposing the resistor 140 which satisfies the matching condition given above in series on the transmission side, impedance matching can be established also by the system shown in FIG. 9. In this instance, even if a signal is reflected on the reception side and comes to the transmission side, signal reflection on the transmission side can be suppressed, and consequently, the signal waveform does not suffer from distortion and the quality thereof is assured.

Further, FIG. 10 shows an ordinary terminating system in a case wherein bidirectional transmission is performed. Referring to FIG. 10, the terminating system shown in FIG. 7 is applied to termination on the opposite ends of a wiring line (signal transmission line) 110 through which bidirectional transmission is performed between a reception buffer 101 provided on a transmission buffer 100 side and a transmission buffer 201 provided on a reception buffer 200 side.

In particular, the output side of the transmission buffer 100 (the input side of the reception buffer 101) is grounded through a resistor 150 having a resistance value Rg1 and connected to a power supply of a voltage V through another resistor 151 having a resistance value Rv1. Meanwhile, the input side of the reception buffer 200 (the output side of the transmission buffer 201) is grounded through a resistor 160 having a resistance value Rg2 and connected to a power supply of the voltage V through another resistor 161 having a resistance value Rv2.

The matching condition in this instance is given by $$Zo = Rv1//Rg1 = Rv2//Rg2$$

and, the signal amplitude A is given by $$A = [(Rv1//Rg1//Rv2//Rg2)/(Rv1//Rg1//Rv2//Rg2 + Zout)] \cdot V$$

where $$Rv1//Rg1//Rv2//Rg2=Rv1 \cdot Rg1 \cdot Rv2 \cdot Rg2/(Rv1 \cdot Rg1 \cdot Rv2+ Rg1 \cdot Rv2 \cdot Rg2+Rv2 \cdot Rg2 \cdot Rv1+Rg2 \cdot Rv1 \cdot Rg1)$$

By connecting the resistors 150, 151 and 160, 161 which satisfy the matching condition given above to the opposite sides of the wiring line 110 to effect termination, also where bidirectional transmission is effected, impedance matching can be established, and since signal reflection from one side of the wiring line 110 can be suppressed, the signal waveform does not suffer from distortion and the quality thereof is assured.

However, in the terminating systems shown in FIGS. 7, 8 and 10, the resistors 120 and 121, 130, 150, 151, 160 and 161 must be mounted, and consequently, if an increased number of such wiring lines (signal transmission lines) 110 are provided on a printed circuit board, then also the number of terminating resistances increases. This requires an increased physical space for mounting a large number of terminating resistances, resulting in reduction of the mounting efficiency and also in increase of the cost.

Further, since the signal amplitude on the reception side is dropped by the terminating resistance, in order to assure a sufficient signal amplitude, it is necessary to raise the driving capacity of the transmission buffer 100 and decrease the output impedance Zout of the transmission side. However, if the driving capacity of the transmission buffer 100 is raised, then since the size of the transmission buffer 100 increase and the area occupied by the transmission buffer 100 in the LSI increases, the number of signals which can be extracted from the single LSI decreases. The problem just described is more conspicuous particularly with such bidirectional transmission wherein the opposite ends of the wiring line 110 must be terminated as seen from FIG. 10.

Further, in the reception side terminating systems, since the wiring line 110 is connected to the ground or a power supply through a terminating resistor, even if a variation of a signal does not occur, current always flows from the transmission side. Consequently, the power dissipation of the transmission side increases as much. Further, as the power dissipation increases, also noise by a power supply which makes a factor of malfunction increases.

On the other hand, in the transmission side terminating system shown in FIG. 9, although such a situation that the signal amplitude decreases on the reception side or the power dissipation on the transmission side increases as in the terminating systems shown in FIGS. 7, 8 and 10 does not occur, it is still necessary to mount the resistor 140. Therefore, if the number of such wiring lines (signal transmission lines) 100 on the printed circuit board increases, then also the number of terminating resistors increases, resulting in increase of the physical space for mounting a large number of terminating resistors and in drop of the mounting efficiency and further in increase of the cost.

Also a terminating method is disclosed in Japanese Patent Laid-Open Application No. Heisei 7-73212 wherein a terminating resistor is not mounted as a discrete part but a wiring line itself has a designated resistance value so that matching of circuitry is established. According to this method, an impedance necessary to establish the matching of the circuitry is distributed uniformly to a wiring line between a signal outputting side element and a signal inputting side element. Consequently, the wiring line itself can be provided with a function as a terminating resistor, and the necessity for a discrete part for establishing matching of the circuitry is eliminated.

However, where an impedance necessary for establishing matching of circuitry is distributed uniformly to a wiring line, if the length of the wiring line is sufficiently short, then the wiring line can function as a terminating resistor, but as the wiring line length increases, that part of the resistance of the wiring line which serves as the terminating resistor is so distributed to the overall wiring line that, after all, the terminating resistance becomes lost, resulting in failure to establish matching of the circuitry and consequently in drop of the quality of the signal waveform. Examples of a waveform (result of a simulation) whose quality is dropped as a result of uniform distribution of an impedance to a wiring line are indicated by broken line curves in FIGS. 3 and 4. The waveforms will be hereinafter described in detail together with waveforms obtained by an apparatus according to a preferred embodiment of the present invention. In any event, the terminating method wherein a terminating resistance is distributed to a wiring line has a problem to be solved in that the length of a wiring line cannot be increased sufficiently since an increase of the length of the wiring line deteriorates the quality of the signal waveform compared with an alternative method wherein a terminating resistance is provided in a concentrated manner at an end of the wiring line.

SUMMARY OF THE INVENTION

It is an object of the present invention to provide a printed circuit board including a terminating structure wherein impedance matching can be established with certainty for a long wiring line without using a discrete part as a terminating resistor.

In order to attain the object described above, according to an aspect of the present invention, there is provided a printed circuit board, comprising a semiconductor unit, and a terminating structure for establishing impedance matching of a printed circuit board wiring line which transmits an electric signal from the semiconductor unit on the printed circuit board, the terminating structure including an internal wiring line connected to a signal output terminal in the semiconductor unit and formed with a resistance value which satisfies an impedance matching condition of the printed circuit board wiring line connected to the signal output terminal.

According to another aspect of the present invention, there is provided a printed circuit board, comprising a plurality of semiconductor units, and a terminating structure for establishing impedance matching of a printed circuit board wiring line which bidirectionally transmits an electric signal between a pair of ones of the semiconductor units on the printed circuit board, the terminating structure including internal wiring lines connected to signal input/output terminals of the semiconductor units and formed with resistance values which satisfy an impedance matching condition of the printed circuit board wiring line connected to the signal input/output terminals.

The semiconductor unit or each of the semiconductor units may be a semiconductor device which includes an LSI or a multi-chip module wherein a plurality of semiconductor devices are mounted on a circuit board.

In each of the printed circuit boards having the constructions described above, the internal wiring line of each semiconductor unit functions as a terminating resistor for establishing impedance matching of the printed circuit board wiring line. In particular, by forming an internal wiring line having a resistance value which satisfies an impedance matching condition in the semiconductor unit, the internal wiring line is arranged as a terminating resistor. Accordingly, impedance matching of the printed circuit board wiring line can be established without using a discrete part as a terminating resistor even if the printed circuit board wiring line connected to the signal output terminal or signal input/output terminal is long.

Where each semiconductor unit is a semiconductor device including an LSI or a multi-chip module, since an internal wiring line of the semiconductor device or the multi-chip module is usually thinner than a printed circuit board wiring line and has a higher resistance, only by adjusting the length of the internal wiring line, the internal wiring line having the resistance value which satisfies the impedance matching condition can be formed readily without performing a special wiring line process.

In this manner, with any of the printed circuit boards described above, since the internal wiring line of each semiconductor unit has a function as a terminating resistor and is arranged as a terminating resistor, even if the printed circuit board wiring line is long, impedance matching of the printed circuit board wiring line can be established without using a discrete part as a terminating resistor and without inviting a drop of the signal amplitude on the reception side or an increase of the power dissipation on the transmission side.

Accordingly, while the quality of the signal waveform is assured, the necessity for a specific terminating resistor, which is usually formed as a discrete part, can be eliminated. Consequently, the space on the printed circuit board can be utilized effectively and the mounting efficiency can be improved. Further, the expanses for such resistances and for a mounting operation for such resistances can be eliminated, and consequently, the cost can be reduced.

Further, since the signal amplitude does not exhibit a drop on the reception side, there is no necessity for raising the driving capacity of a transmission buffer, and any disadvantage which is caused by an increase in size of the transmission buffer can be eliminated.

Furthermore, the necessity for increasing the power dissipation on the transmission side is eliminated, and noise by a power supply which causes a factor of malfunction can be suppressed.

Particularly with a wiring line over which bidirectional transmission is performed, since a large number of terminating resistors are required usually, the effects described above can be achieved further significantly by applying any of the terminating structures of the present invention described above.

The above and other objects, features and advantages of the present invention will become apparent from the following description and the appended claims, taken in conjunction with the accompanying drawings in which like parts or elements denoted by like reference symbols.

DESCRIPTION OF THE PREFERRED EMBODIMENTS

A. First Embodiment

Figure 2:
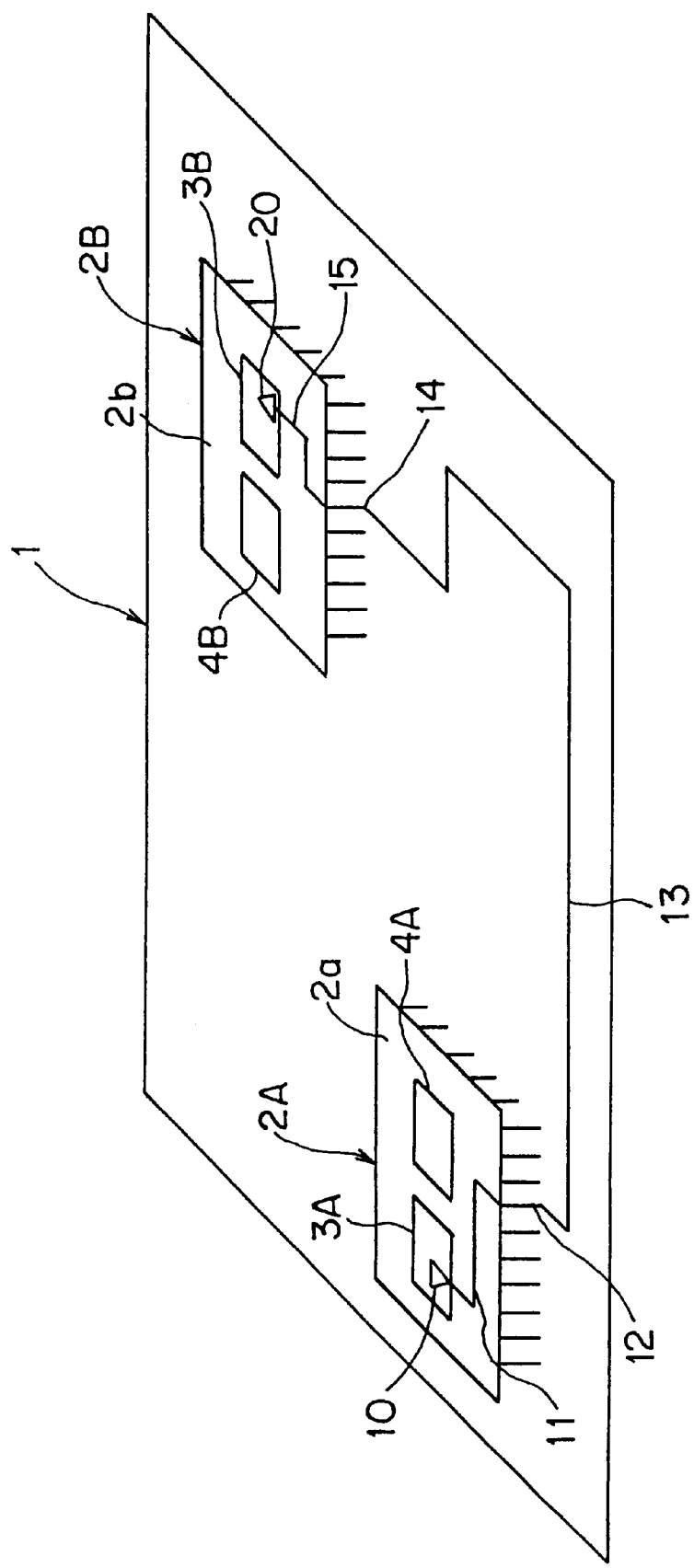
FIG. 2 is a perspective view schematically showing a printed circuit board to which the terminating structure according to the first embodiment is applied.

Referring first to FIG. 2, two MCMs 2A and 2B as semiconductor units are mounted on a printed circuit board 1 to which a terminating structure according to a first preferred embodiment of the present invention is applied. The MCM 2A includes two LSIs (semiconductor devices) 3A and 4A on an MCM circuit board 2a. Similarly, the MCM 2B includes two LSIs (semiconductor devices) 3B and 4B on an MCM circuit board 2b. Internal wiring lines (refer to reference numerals 11 and 15) of the MCMs 2A and 2B are usually thinner than wiring lines (refer to reference numeral 13) on the printed circuit board 1, and the resistances of the internal wiring lines are approximately 10 times higher than those of the wiring lines on the printed circuit board 1.

The terminating structure according to the first embodiment is provided to establish impedance matching of the printed circuit board wiring line 13 for interconnecting an output pin (signal outputting terminal) 12 of the MCM 2A and an input pin (signal inputting terminal) 14 of the MCM 2B on the printed circuit board 1.

In the terminating structure according to the first embodiment, the internal wiring line 11 which interconnects a transmission buffer (driving element) 10 of the LSI 3A and the output pin 12 in the MCM 2A is formed with a length corresponding to a resistance value Rline which satisfies an impedance matching condition of the printed circuit board wiring line 13, and thus achieves a function as a transmission side terminating resistor.

Here, where the characteristic impedance of the printed circuit board wiring line 13 is represented by Zo and the output impedance of the transmission buffer 10 is represented by Zout, the matching condition is given by $$Zo = Zout + Rline$$

It is to be noted that, where the power supply voltage is represented by V, the signal amplitude A is given by A=V.

Further, in the MCM 2B on the reception side, the input pin 14 connected to the printed circuit board wiring line 13 is connected to a reception buffer 20 of the LSI 3B by the internal wiring line 15. The internal wiring line 15 is thinner than the printed circuit board wiring line 13 and has a certain resistance value. However, the resistance (internal wiring line 15) present on the reception side has little influence on the signal quality.

In the terminating structure according to the first embodiment having the construction described above, when an electric signal (digital signal) is transmitted from the transmission buffer 10 of the LSI 3A of the MCM 2A to the reception buffer 20 of the LSI 3B of the MCM 2B through the internal wiring line 11, output pin 12, printed circuit board wiring line 13, input pin 14 and internal wiring line 15, the internal wiring line 11 of the MCM 2A exhibits a function as a terminating resistor for establishing matching impedance of the printed circuit board wiring line 13.

In other words, by forming the internal wiring line 11 in the MCM 2A such that it has a length corresponding to the resistance value Rline which satisfies the impedance matching condition (Zo=Zout+Rline) given hereinabove, the internal wiring line 11 is arranged in a concentrated manner as a terminating resistor.

For example, it is assumed that the output impedance Zout of the transmission buffer 10 of the LSI 3A is 30Ω, the resistance value of the internal wiring line 11 of the MCM 2A per unit wiring line length is 10Ω/cm, and the characteristic impedance Zo of the printed circuit board wiring line 13 is 50Ω. In this instance, since the condition for full matching is Zo=Zout+Rline, $$50\Omega=30\Omega+10\Omega/cm\times 2\ cm$$

Consequently, by adjusting the internal wiring line 11 between the transmission buffer 10 and the output pin 12 so that it has a length of 2 cm, a terminating structure which establishes full impedance matching can be formed.

Figure 3:
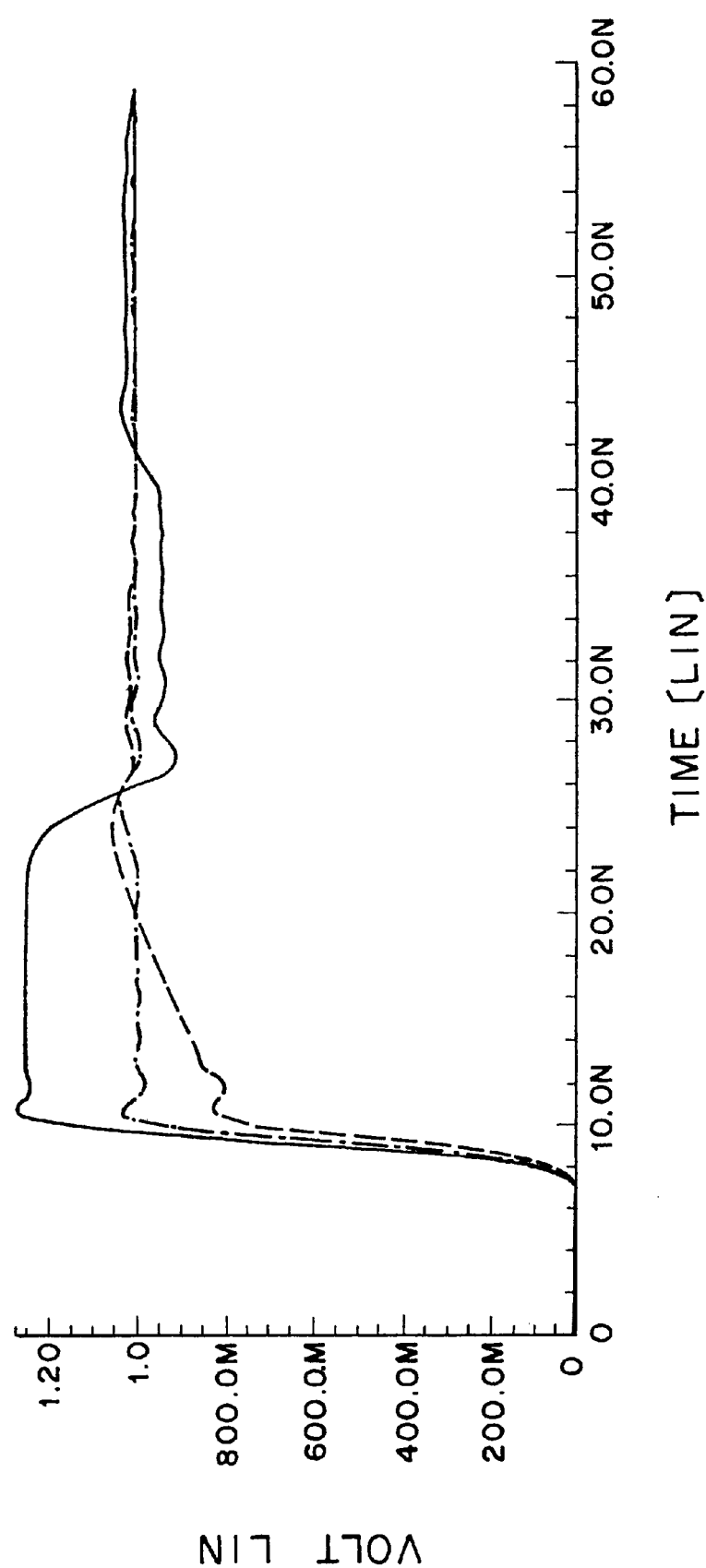
FIG. 3 is a graph showing an example of a signal waveform (result of simulation) obtained by the terminating structure according to the first embodiment in comparison with another waveform obtained where no terminating resistor is provided and a further waveform obtained where a terminating resistance is distributed uniformly to a wiring line.
Figure 4:
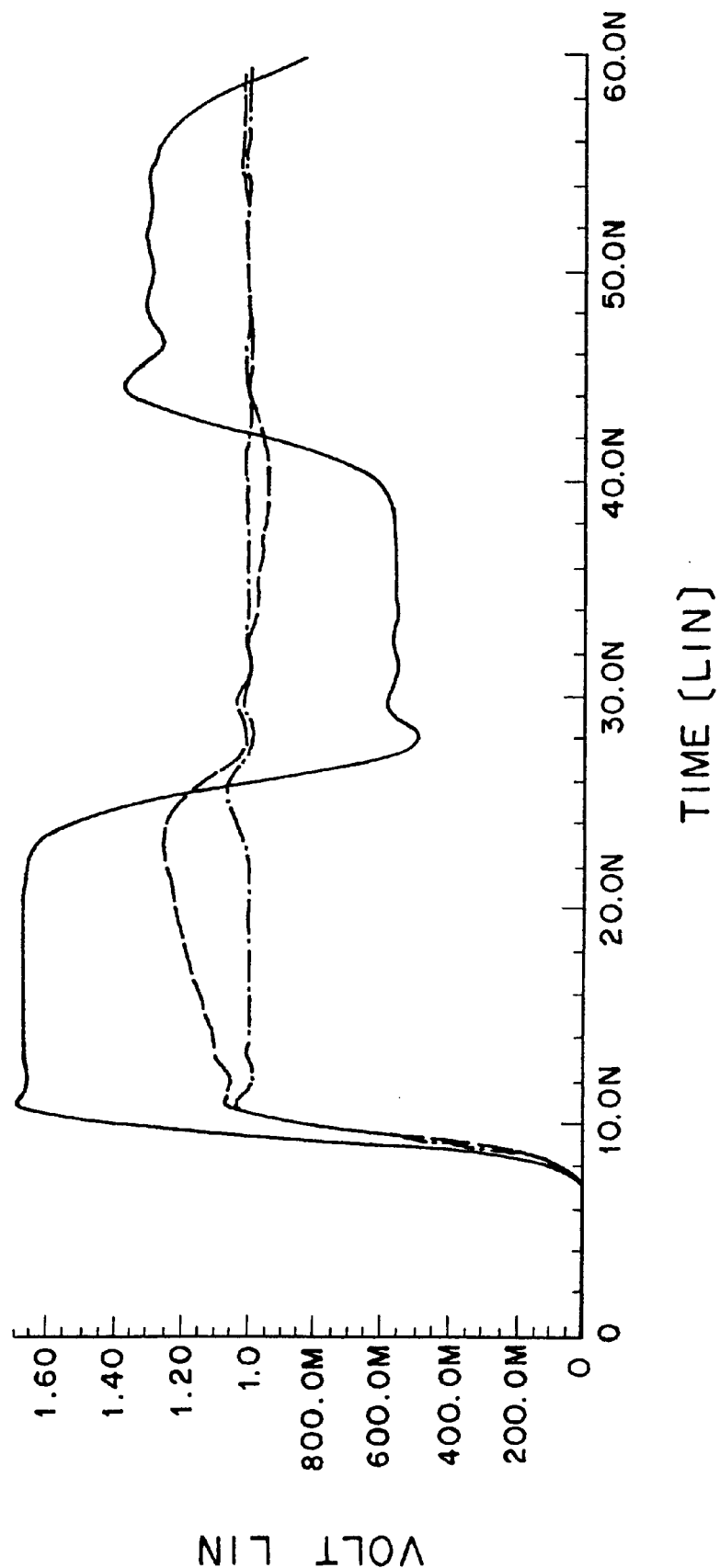
FIG. 4 is a graph showing another example of a signal waveform (result of simulation) obtained by the terminating structure according to the first embodiment in comparison with another waveform obtained where no terminating resistor is provided and a further waveform obtained where a terminating resistance is distributed uniformly to a wiring line.

FIGS. 3 and 4 show different examples of a signal waveform (simulation result) obtained using the terminating structure according to the first embodiment in comparison with signal waveforms obtained where no terminating resistor was involved and where a terminating resistance was distributed uniformly to a wiring line. It is to be noted that, in the simulation conducted actually, for the printed circuit board wiring line 13, a model whose characteristic impedance was 50Ω and which is employed popularly was used. Meanwhile, for the simulation of the signal waveform where a terminating resistance was distributed uniformly to a wiring line, a model whose characteristic impedance of 50Ω was distributed as a dc resistance to a wiring line was used.

In FIG. 3, simulation results wherein the printed circuit board wiring line 13 was 100 cm long and the output impedance of the transmission buffer 10 was 30Ω are indicated. A solid line curve indicates the signal waveform where no terminating structure was involved [the MCM wiring line (internal wiring line) had a resistance of substantially zero], and a broken line curve indicates the signal waveform where the terminating resistance was distributed uniformly to a wiring line. Meanwhile, an alternate long and short dash line curve indicates the signal waveform where the terminating structure according to the first embodiment was employed (where the internal wiring line 11 of 10Ω/cm was formed with the length of 2 cm).

Meanwhile, FIG. 4 illustrates simulation results wherein the printed circuit board wiring line 13 was 100 cm long and the output impedance of the transmission buffer 10 was 10Ω are indicated. In FIG. 4, a solid line curve indicates the signal waveform where no terminating structure was involved [the MCM wiring line (internal wiring line) had a resistance of substantially zero], and a broken line curve indicates the signal waveform where the terminating resistance was distributed uniformly to a wiring line. Meanwhile, an alternate long and short dash line curve indicates the signal waveform where the terminating structure according to the first embodiment was employed (where the internal wiring line 11 of 10Ω/cm was formed with the length of 4 cm).

The quality of the transmission waveform becomes higher as the variation in magnitude upon variation from the 0 level to the 1 level decreases. As can be apparently seen from the simulation results indicated in FIGS. 3 and 4, where no terminating structure is involved (solid line curves), the variation in magnitude is very large and the quality of the signal waveform is very low. Meanwhile, where the terminating resistance is distributed uniformly to the wiring line (broken line curves), the waveform after variation from the 0 level to the 1 level gradually rises, and therefore, the waveform does not have a high quality. In contrast, where the terminating structure according to the present embodiment is applied (alternate long and short dash line curves), the waveform after variation from the 0 level to the 1 level is stable and has a high quality.

In this manner, with the terminating structure according to the first embodiment of the present invention, since the internal wiring line 11 of the MCM 2A has a function as a terminating resistor and is arranged in a concentrated manner as a terminating resistor, even if the printed circuit board wiring line 13 is long, the impedance of the printed circuit board wiring line 13 can be matched with certainty without using a discrete part as a terminating resistor and without causing a drop of the signal amplitude on the transmission side or an increase of the power dissipation on the transmission side.

Accordingly, a terminating resistor formed as a discrete part can be eliminated while assuring the quality of the signal waveform, and the space on the printed circuit board 1 can be utilized effectively and the mounting efficiency can be improved significantly. Besides, the expenses required for such resistors and for mounting operation of them are eliminated, and consequently, the cost can be reduced.

Further, since the signal amplitude does not exhibit a drop on the reception side, there is no necessity for raising the driving capacity of the transmission buffer 10, and any disadvantage which may be caused by an increase in size of the transmission buffer 10 can be eliminated.

Furthermore, the necessity for increasing the power dissipation on the transmission side is eliminated, and noise by a power supply which makes a cause of malfunction can be suppressed.

Further, since the internal wiring line 11 having such a construction as described above is formed by an ordinary wiring process for the MCM circuit board 2a, the internal wiring line 11 having a resistance value Rline which satisfies an impedance matching condition can be formed readily only by adjusting the length of the internal wiring line 11 without requiring any special wiring process.

B. Second Embodiment

Figure 1:
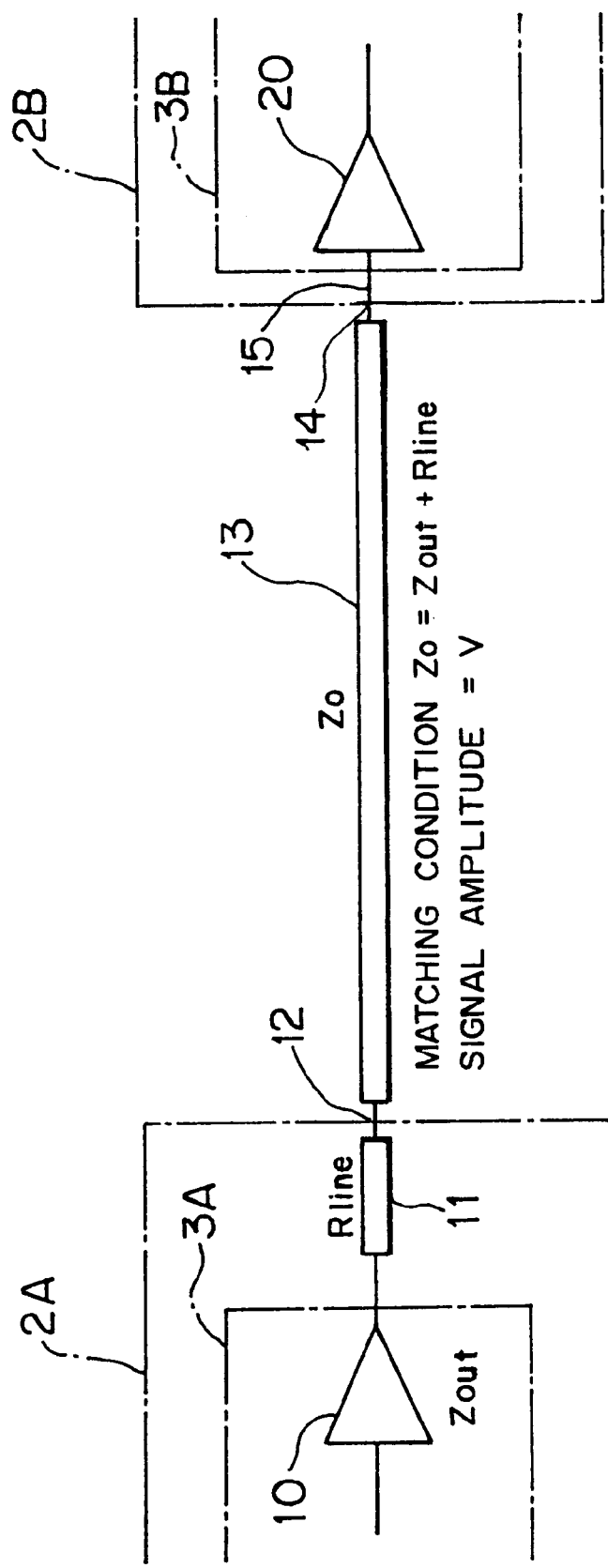
FIG. 1 is a diagrammatic view showing a terminating structure for a printed circuit board wiring line according to a first embodiment of the present invention.
Figure 5:
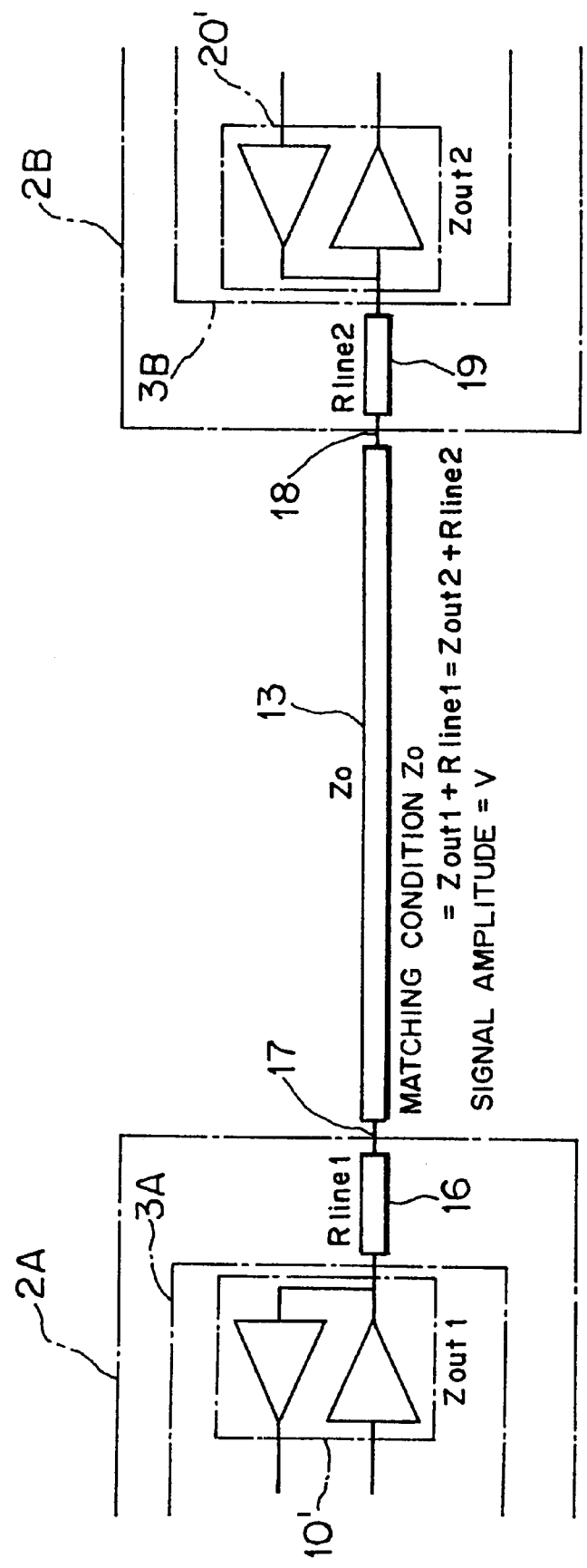
FIG. 5 is a diagrammatic view showing a terminating structure for a printed circuit board wiring line according to a second embodiment of the present invention.
Figure 6:
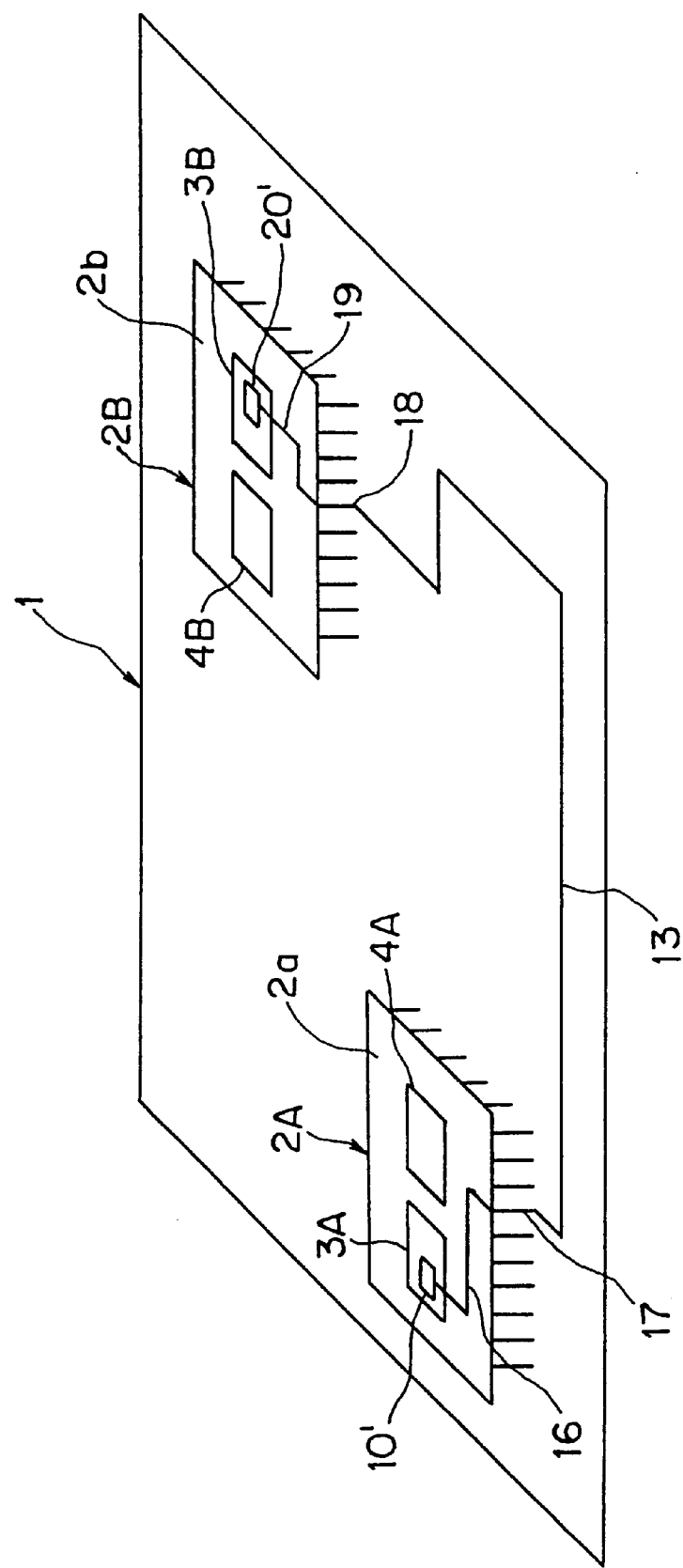
FIG. 6 is a perspective view schematically showing a printed circuit board to which the terminating structure according to the second embodiment is applied.
Figure 7:
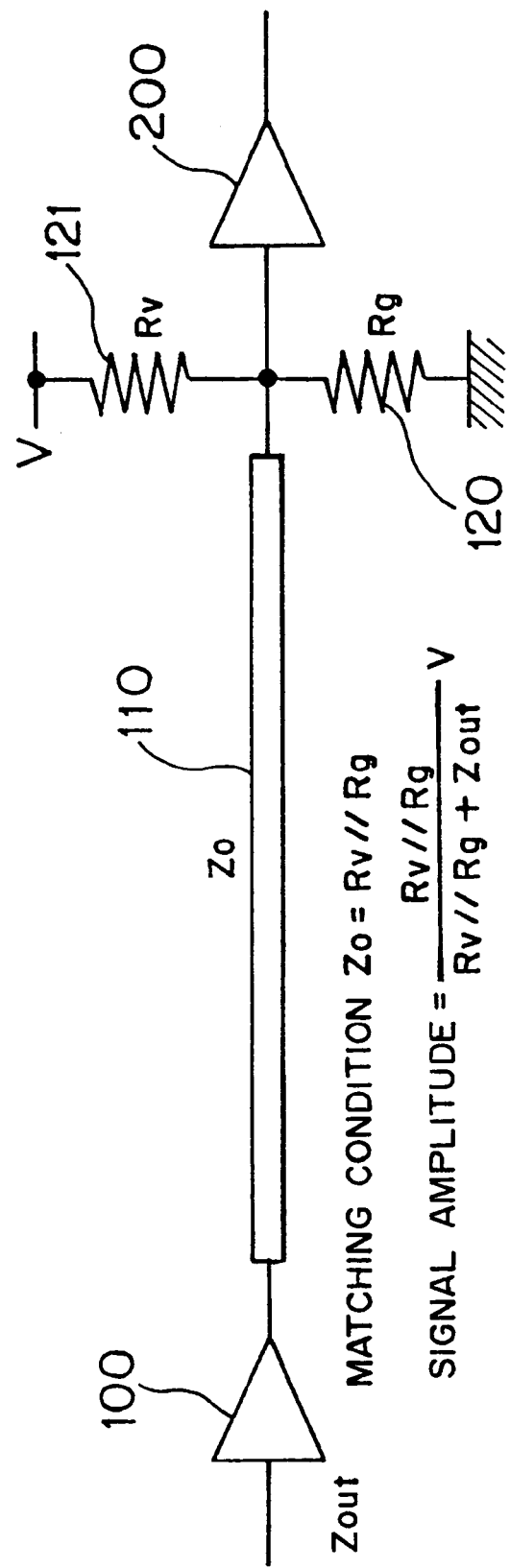
FIG. 7 is a diagrammatic view showing an ordinary reception side terminating system.
Figure 8:
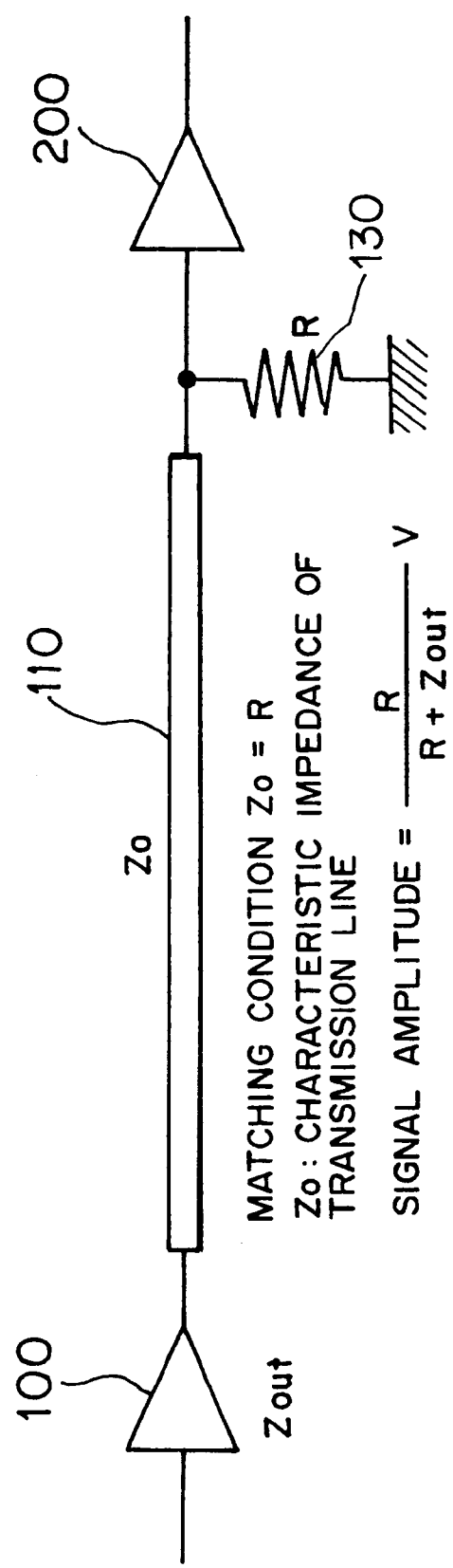
FIG. 8 is a similar view but showing another ordinary reception side terminating system.
Figure 9:
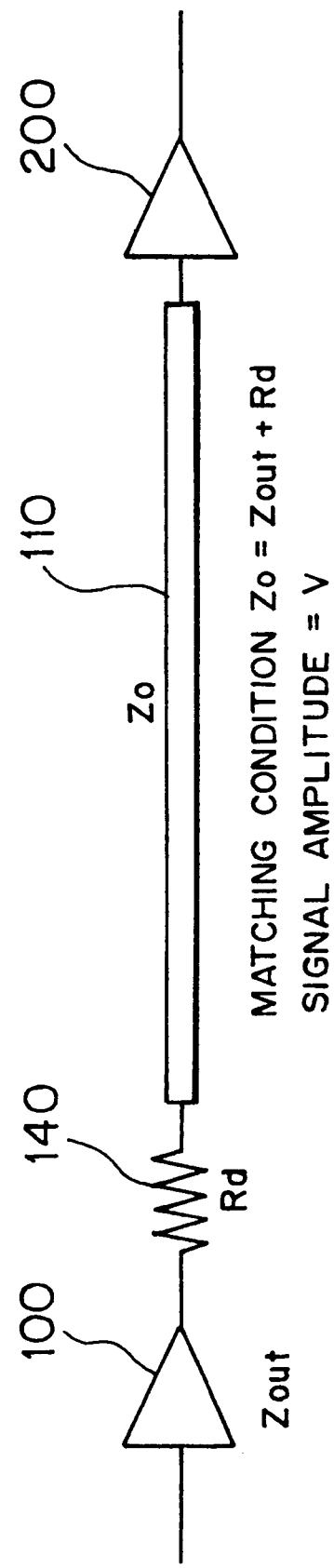
FIG. 9 is a diagrammatic view showing an ordinary transmission side terminating system.
Figure 10:
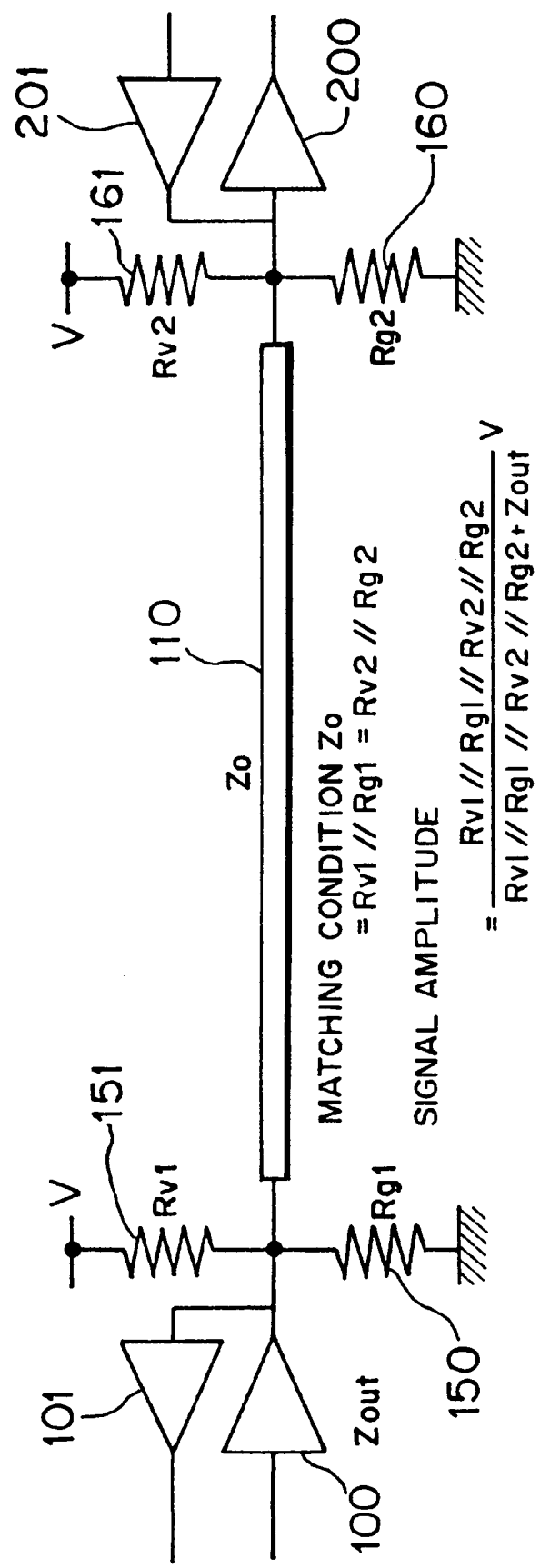
FIG. 10 is a diagrammatic view illustrating an ordinary terminating method used where bidirectional transmission is effected.

FIG. 5 shows a terminating structure for a printed circuit board wiring line according to a second preferred embodiment of the present invention, and FIG. 6 schematically shows in perspective view a printed circuit board to which the terminating structure of the second embodiment is applied. It is to be noted that, in FIGS. 5 and 6, like elements to those of FIGS. 1 and 2 are denoted by like reference symbols, and overlapping description of them is omitted herein to avoid redundancy.

Referring first to FIG. 6, two MCMs 2A and 2B as semiconductor units are mounted also on a printed circuit board 1 to which the terminating structure according to the second embodiment is applied, similarly as in the first embodiment. In the second embodiment, however, LSIs 3A and 3B provided in the MCMs 2A and 2B include, in place of the transmission buffer 10 and the reception buffer 20 described hereinabove, bidirectional buffers (transmission and reception elements) 10' and 20', and an input/output pin (signal input/output terminal) 17 of the MCM 2A and an input/output pin (signal input/output terminal) 18 of the MCM 2B are connected to each other by a printed circuit board wiring line 13 so that an electric signal (digital signal) may be transmitted bidirectionally between the LSIs 3A and 3B.

The terminating structure according to the second embodiment is provided to establish impedance matching of the printed circuit board wiring line 13 which interconnects the input/output pin 17 of the MCM 2A and the input/output pin 18 of the MCM 2B on the printed circuit board 1, as described hereinabove.

Referring now to FIGS. 5 and 6, in the terminating structure according to the second embodiment, an internal wiring line 16 which interconnects the bidirectional buffer 10' of the LSI 3A and the input/output pin 17 in the MCM 2A is formed with a length corresponding to a resistance value Rline1 which satisfies an impedance matching condition of the printed circuit board wiring line 13 and exhibits a function as a terminating resistor. Similarly, an internal wiring line 19 which interconnects the bidirectional buffer 20' of the LSI 3B and the input/output pin 18 in the MCM 2B is formed with a length corresponding to a resistance value Rline2 which satisfies the impedance matching condition of the printed circuit board wiring line 13 and exhibits a function as a terminating resistor.

Here, where the characteristic impedance of the printed circuit board wiring line 13 is represented by Zo and the output impedances of the bidirectional buffers 10' and 20' are represented by Zout1 and Zout2, respectively, the matching condition is given by $$Zo=Zout1+Rline1=Zout2+Rline2$$

It is to be noted that, where the power supply voltage is represented by V, the signal amplitude A is given by A=V.

In the terminating structure according to the second embodiment having the construction described above, when an electric signal (digital signal) is transmitted bidirectionally between the bidirectional buffer 10' of the LSI 3A of the MCM 2A and the bidirectional buffer 20' of the LSI 3B of the MCM 2B through the internal wiring line 16, input/output pin 17, printed circuit board wiring line 13, input/output pin 18 and internal wiring line 19, the internal wiring line 16 of the MCM 2A and the internal wiring line 19 of the MCM 2B function as terminating resistors for establishing impedance matching of the printed circuit board wiring line 13.

In particular, by forming, in the MCMs 2A and 2B, the internal wiring lines 16 and 19 with lengths corresponding to the resistance values Rline1 and Rline2 which satisfy the impedance matching condition (Zo=Zout1+Rline1=Zout2+Rline2) given hereinabove, respectively, the internal wiring lines 16 and 19 are arranged in a concentrated manner individually as terminating resistors.

It is assumed that, for example, the output impedances Zout1 and Zout2 of the bidirectional buffers 10' and 20' are 30Ω and the resistance values of the internal wiring lines 16 and 19 in the MCMs 2A and 2B per unit wiring line length are 10Ω/cm while the characteristic impedance Zo of the printed circuit board wiring line 13 is 50Ω. In this instance, the condition for full matching is given, since Zo=Zout1+Rline1=Zout2+Rline2, by $$50Ω=30Ω+10Ω/cm×2\ cm$$

Consequently, terminating structures by which full impedance matching is established can be formed by adjusting the internal wiring lines 16 and 19 between the bidirectional buffers 10' and 20' and the input/output pins 17 and 18 so that they may be 2 cm long. It is to be noted that the resistance present on the reception side has little influence on the signal quality.

In this manner, also with the terminating structure according to the second embodiment of the present invention, similar effects to those of the first embodiment can be achieved. Particularly, while a terminating structure for bidirectional transmission normally requires a large number of terminating resistors, where the terminating structure of the present invention as in the second embodiment is applied to bidirectional transmission, the necessity for such a large number of terminating resistors can be eliminated, and the effects achieved by the first embodiment are achieved further significantly.

C. Others

It is to be noted that the present invention is not limited to the specific embodiments described above and can be carried out in various forms without departing from the spirit or scope of the present invention.

For example, while each of the semiconductor units in the embodiments described above is an MCM, the present invention is not limited to this, and the semiconductor unit in the present invention may be a semiconductor device such as an LSI. For example, by adjusting, on an LSI chip, an internal wiring line for interconnecting a buffer in the LSI and a terminal of the LSI so that it may function as a terminating resistor, similar effects to those of the embodiments described hereinabove can be achieved.

The present invention is not to the specifically described embodiment, and variations and modifications can be made without departing from the scope of the present invention.

What is claimed is:

1. A circuit board unit comprising:
   a circuit board including
      a first substrate,
      at least two terminals disposed on said first substrate, and
      a first wiring line disposed on said first substrate and interconnecting between said terminals; and
   at least two semiconductor units mounted on said circuit board in electrical contact with the respective terminals of said circuit board so that said semiconductor units are interconnected by said first wiring line of said circuit board, one of said semiconductor units including
      (i) a second substrate,
      (ii) a semiconductor mounted on said second substrate and having at least one output pin via which said semiconductor outputs an electrical signal, and
      (iii) a second wiring line, disposed in said second substrate and interconnecting between the output pin of said semiconductor and a corresponding one of said terminals of said circuit board, said second wiring line having a predetermined resistance which ensures an impedance matching for said first wiring line of said circuit board such that said second wiring line functions as a resistance termination of said first wiring line.

2. A circuit board unit as claimed in claim 1, wherein said one semiconductor unit is a multi-chip module in which a plurality of semiconductors are mounted on said second substrate.

3. A circuit board unit as claimed in claim 1, wherein said semiconductor of said one semiconductor unit is a large-scale integrated circuit (LSI).

4. A circuit board unit as claimed in claim 1, wherein said circuit board is a printed circuit board in which said first wiring line is printed on said first substrate.

5. A circuit board unit comprising:
   a circuit board including
      a first substrate,
      at least two terminals disposed on said first substrate, and
      a first wiring line disposed on said first substrate and interconnecting between said terminals; and
   at least two semiconductor units mounted on said circuit board in electrical contact with the respective terminals of said circuit board so that said semiconductor units are interconnected by said first wiring line of said circuit board, one of said semiconductor units including
      (i) a second substrate,
      (ii) a semiconductor mounted on said second substrate and having at least one input/output pin via which said semiconductor outputs and inputs an electrical signal, and
      (iii) a second wiring line, disposed in said second substrate and interconnecting between the input/output pin of said semiconductor and a respective one of said terminals of said circuit board, said second wiring line having a predetermined resistance which ensures an impedance matching for said first wiring line of said circuit board such that said second wiring line functions as a resistance termination of said first wiring line.

6. A circuit board unit as claimed in claim 5, wherein each said semiconductor unit is a multi-chip module in which a plurality of semiconductors are mounted on said second substrate.

7. A circuit board unit as claimed in claim 5, wherein said semiconductor of each of said semiconductor units is a large-scale integrated circuit (LSI).

8. A circuit board unit as claimed in claim 5, wherein said circuit board is a printed circuit board in which said first wiring line is printed on said first substrate.

* * * * *